United States Patent
Zhao

(10) Patent No.: US 7,724,017 B2
(45) Date of Patent: May 25, 2010

(54) MULTI-CHANNEL PULSE TESTER

(75) Inventor: Yuegang Zhao, Solon, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 390 days.

(21) Appl. No.: 11/513,749

(22) Filed: Aug. 31, 2006

(65) Prior Publication Data

US 2008/0054930 A1   Mar. 6, 2008

(51) Int. Cl.
*G01R 31/28* (2006.01)

(52) U.S. Cl. ...................................... 324/765

(58) Field of Classification Search ............... 324/158.1, 324/754–765; 438/14, 17; 361/56, 111; 257/40, 48
See application file for complete search history.

(56) References Cited

U.S. PATENT DOCUMENTS

| | | | | |
|---|---|---|---|---|
| 4,646,299 A | * | 2/1987 | Schinabeck et al. | 714/736 |
| 6,396,298 B1 | * | 5/2002 | Young et al. | 324/769 |
| 7,103,861 B2 | * | 9/2006 | Ang et al. | 716/4 |
| 7,224,160 B1 | * | 5/2007 | Pronin | 324/158.1 |
| 7,403,031 B2 | * | 7/2008 | Okawa | 324/769 |
| 2002/0145432 A1 | * | 10/2002 | Allard et al. | 324/458 |
| 2005/0128655 A1 | * | 6/2005 | Cuevas et al. | 361/18 |

OTHER PUBLICATIONS

Efficient Microwave Bias and Testing Using the HP 4142B Modular DC Source/Monitor. Hewlett Packard. Application Note 1205 (Date: At least as early as Aug. 30, 2006.).

* cited by examiner

*Primary Examiner*—Ha Tran T Nguyen
*Assistant Examiner*—Trung Q Nguyen
(74) *Attorney, Agent, or Firm*—Pearne & Gordon LLP

(57) ABSTRACT

A method for testing a plurality of DUTs using a plurality of DC instruments and a pulsed instrument includes contemporaneously applying DC signals to the DUTs with respective DC instruments and sequentially performing pulsed measurements on the DUTs with the pulsed instrument.

5 Claims, 1 Drawing Sheet

MULTI-CHANNEL PULSE TESTER

BACKGROUND OF THE INVENTION

The present invention relates to the testing of semiconductor devices and, in particular, to the use of pulsed testing.

Testing of semiconductor devices, e.g., field effect transistors, presents ever increasing challenges. Geometries shrink, complexity increases, power density increases, speed increases and new materials and manufacturing processes are introduced.

Old testing methods are often unsatisfactory in light of these developments. New methodologies are needed to provide the metrics necessary for the implementation and monitoring of these advances.

SUMMARY OF THE INVENTION

A method for testing a plurality of devices under test (DUTs) using a plurality of DC instruments and a pulsed instrument includes contemporaneously applying DC signals to the DUTs with respective DC instruments and sequentially performing pulsed measurements on the DUTs with the pulsed instrument.

DESCRIPTION OF THE PREFERRED EMBODIMENTS

Figure 1:
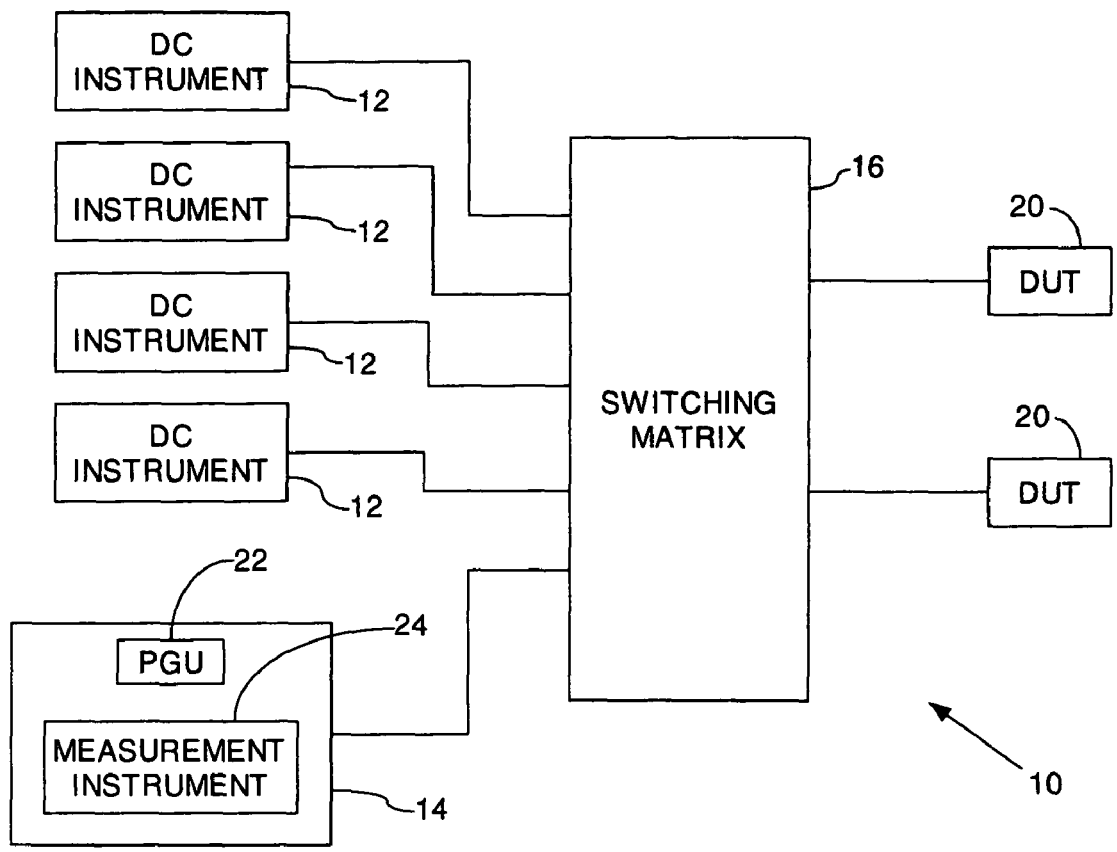
FIG. 1 is a block diagram of an example of an apparatus suitable for practicing the invention.

Referring to FIG. 1, a test apparatus 10 includes DC instruments 12, a pulsed instrument 14, and a switching matrix 16. In operation, the test apparatus 10 is connected to devices under test (DUTs) 20 to perform tests thereon.

The DC instruments 12 may be, for example, precision voltage sources, precision current sources, or devices capable of both functions such as source measure units (SMUs). SMUs can very accurately source a voltage or a current and then very accurately measure the resulting current or voltage, respectively.

The pulsed instrument 14 may be, for example, a pulse generation unit (PGU) 22 in combination with a measurement instrument 24. Typically, a PGU provides pulses of desired amplitude, length, shape and rate. The measurement instrument 18 may be, for example, a digital oscilloscope or other device suitable for measuring, processing or recording the effects of the signals applied to the DUTs.

The switching matrix 16 is configured to connect or disconnect a DC instrument 12 to a respective DUT 20. In operation, these connections are made contemporaneously, thus providing an array of parallel DC instrument to DUT connections.

The switching matrix 16 also is configured to connect or disconnect the pulsed instrument 14 sequentially to each DUT 20.

Because of the differences in characteristics between DC and pulsed signals, it may be advantageous to split the switching matrix 16 into a DC switch portion and an AC switch portion.

As an example, the overall operation of the apparatus 10 may be controlled from programing contained within any of the instruments in the apparatus 10 as such instruments will often contain substantial circuitry for providing such functions. Alternatively, for example, an unshown separate computer system or other controller may be connected to each component of the apparatus 10 to control the operation of the apparatus.

Figure 2:
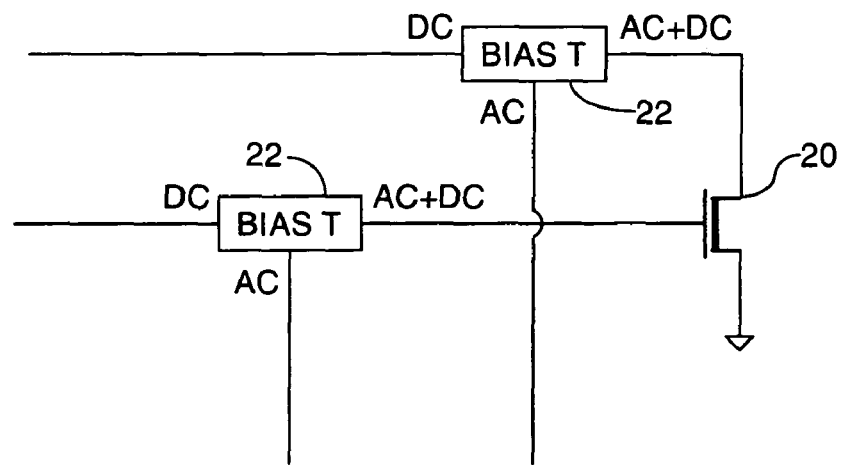
FIG. 2 is a block diagram of an example DUT connection.

Referring to FIG. 2, each DUT 20 may be wired to the test apparatus 10 through one or more bias tees 22. A bias tee 22 has a DC port for DC signals, an AC port for AC signals (e.g., pulsed signals) and an AC-DC port for both AC and DC signals. A simple bias tee may include, for example, a capacitor to block DC from exiting through the AC port and an inductor to block AC from exiting through the DC port. Both AC and DC signals may pass through the AC-DC port.

In operation, the DC instruments 12 contemporaneously apply DC signals to respective DUTs 20. Then the pulsed instrument 14 sequentially performs pulsed measurements on the DUTs.

Two examples of the use of this method include testing of devices for negative bias temperature instability (NBTI) and reliability in high-κ gate dielectric devices.

In NBTI testing DC signals are applied to the DUT to "stress" the DUT. Typically these signals are outside of the normal operating range of the device and are used to obtain accelerated estimates of the device's characteristics such as expected lifetime, or other changes that would occur over a long period of time.

It is often a characteristic of devices that they will recover or "relax" from this stress if a measurement of the effect of the stress on the device is not made quickly. The stress application may need to be quite long, but a millisecond can be too long to perform the measurement after removal of the stress.

By stressing the DUTs in parallel, the undesirable delay of having to stress each device sequentially is avoided. Using pulsed measurements on each device sequentially avoids having to have a pulsed instrument for each DUT connection, as the pulsed measurements can be short enough to avoid relaxation. Even though the last DUT tested has several DUTs ahead of it, the test times may, for example, only be on the order of 100 nanoseconds each, allowing many DUTs to be tested before relaxation becomes a problem.

In operation, the DC instruments 12 contemporaneously apply DC signals to respective DUTs 20 to stress the DUTs 12. Then the pulsed instrument 14 sequentially performs pulsed measurements on the DUTs. This provides measurements with minimal relaxation effects.

As geometries shrink, high-κ gate dielectric devices are becoming more popular. Examples of high-κ dielectrics include hafnium oxide, zirconium oxide and alumina. One problem with these devices is charge-trapping in these dielectrics.

Charges in the dielectric affect the performance and reliability of the device. However, the measurement itself can affect the trapped charges and thereby the quality of the measurement. If the measurements can be made quickly this affect is avoided.

Using pulsed measurements on each device sequentially avoids having to have a pulsed instrument for each DUT connection, as the pulsed measurements can be short enough to avoid charge trapping effects. Even though the last DUT tested has several DUTs ahead of it, the test times may only be on the order of 100 nanoseconds each, allowing many DUTs to be tested before charge trapping effects become a problem.

In operation, the DC instruments 12 contemporaneously apply DC signals to respective DUTs 20. Then the pulsed instrument 14 sequentially performs pulsed measurements on the DUTs. This provides measurements with minimal charge trapping effects. For example, the measurements can be pulse I-V measurements for the DUT's.

It should be evident that this disclosure is by way of example and that various changes may be-made by adding, modifying or eliminating details without departing from the fair scope of the teaching contained in this disclosure. The invention is therefore not limited to particular details of this disclosure except to the extent that the following claims are necessarily so limited.

What is claimed:

1. A method for testing a plurality of DUTs using a plurality of DC instruments and a pulsed instrument, said method comprising:
   contemporaneously applying DC signals to said DUTs with respective DC instruments; and
   sequentially connecting to said DUTs and performing pulsed measurements on said DUTs with said pulsed instrument.

2. A method for testing a plurality of DUTs using a plurality of DC instruments and a pulsed instrument, said method comprising:
   contemporaneously applying DC signals to said DUTs with respective DC instruments to stress said DUTs; and
   sequentially connecting to said DUTs and performing pulsed measurements on said DUTs with said pulsed instrument, wherein relaxation effects on said pulsed measurements are minimized.

3. A method according to claim 2, wherein said testing is for bias temperature instability.

4. A method for testing a plurality of DUTs having "high-κ" gate dielectrics using a plurality of DC instruments and a pulsed instrument, said method comprising:
   contemporaneously applying DC signals to said DUTs with respective DC instruments; and
   sequentially connecting to said DUTs and performing pulsed measurements on said DUTs with said pulsed instrument, wherein charge trapping effects on said pulsed measurements are minimized.

5. A method according to claim 4, wherein said testing is for a pulse I-V measurement.

* * * * *